MEANS FOR ANCHORING AND CONNECTING LEAD WIRES IN AN ELECTRICAL COMPONENT

Filed July 1, 1964

INVENTORS
LYNN J. BRADY
WILLIAM M. FABER SR.
BY John J. Gaydos
ATTORNEY

United States Patent Office 3,280,378

Patented Oct. 18, 1966

3,280,378

MEANS FOR ANCHORING AND CONNECTING LEAD WIRES IN AN ELECTRICAL COMPONENT

Lynn J. Brady and William M. Faber, Sr., Elkhart, Ind., assignors to CTS Corporation, Elkhart, Ind., a corporation of Indiana Filed July 1, 1964, Ser. No. 379,684

10 Claims. (Cl. 317—101)

The present invention relates to electrical components, and, more particularly, to an electrical component of the modular type containing a supporting substrate.

With the advent of miniature electrical devices, the trend toward assembling a plurality of electrical devices in a single modular package is rapidly increasing. Obviously, many advantages are obtained by prepackaging the electrical devices. These small packages, commonly referred to as circuit modules, because of their small size, are ideal for use in electronic equipment such as computers and the like which employ thousands of identical or similar circuit modules.

In order that the terminology used in the specification will be fully understood, certain terms are being defined below:

Electrical Device—Includes both active and passive devices.

Active Device—Denotes an electrical circuit element, e.g., a diode or a transistor, capable of performing amplifying or control functions.

Passive Device—Denotes an electrical circuit element not capable of performing amplifying or control functions, e.g., a resistor or a capacitor.

Circuit Module—Denotes an electrical component or packaged circuit containing a plurality of electrical devices of a size that at least 200,000 electrical devices supported by a plurality of circuit modules can be packaged in one cubic foot.

In general, each of the circuit modules resembles a box or packaged circuit having a plurality of lead wires or terminal pins extending outwardly therefrom for connecting the circuit module into a circuit of the electronic equipment. Heretofore, the lead wires have been, for example, molded into the material forming the outer dimensions of the box. In other words, some circuit modules comprise a plurality of electrical devices supported by a mounting board of vulcanized fiber or the like having a plurality of lead wires extending outwardly from the mounting board. After the electrical devices are connected to the lead wires, the mounting board supporting the electrical device is encapsulated in a suitable electrically insulative material such as plastic. When ceramic dielectric bodies are employed as the substrate for supporting the electrical devices, the ends of the lead wires are generally soldered or welded to conductive paths bonded and supported by the same surface of the body supporting the electrical devices. Although satisfactory for certain type circuit modules, the soldered or welded connection frequently is twisted or loosened at the junction during handling and consequently the resistance of the connection is increased or else the lead wire and solder completely separates from the conductive path forming an open circuit. If the pull force of the soldered or welded connection is increased, then the bond between the conductive path and the ceramic dielectric body limits the maximum pull force of the connection. It would, therefore, be desirable to provide a circuit module having improved electrical connections to the electrical devices.

Other circuit modules comprising a substrate of ceramic dielectric material provided with through bores having disposed therein headed lead wires, i.e., nail-shaped lead wires, or terminal pins are currently used with circuit modules for certain electronic equipment. Although the circuit modules with headed lead wires are satisfactory, caution must be exercised to avoid damage to the circuit modules when the lead wires are being inserted into the connectors of a mounting panel. Moreover, by inserting lead wires into the bores which extend completely through the substrate and communicate with the major surface thereof, i.e., the surface supporting the electrical devices, the size of the substrate is increased since the major surface thereof supporting the electrical devices must be sufficiently large to provide adequate area or space for the through bores and the heads of the lead wires as well as for the electrical devices. It would, therefore, be desirable to provide an improved circuit module having a substrate of ceramic dielectric material with improved anchoring means for the lead wires or terminal pins.

As the size of the circuit modules decreases, additional problems are always encountered such as dissipating the heat generated by the electrical devices and providing good electrical connections between the lead wires and the electrical devices. It would, therefore, also be desirable to provide a circuit module having a supporting surface or substrate substantially smaller than heretofore available with good heat dissipating properties for dissipating the generated heat.

Accordingly, it is an object of the present invention to provide a new and improved circuit module comprising a plurality of electrical devices supported on a substrate of ceramic dielectric material or on a supporting surface having the various desirable features set forth above.

Another object of the present invention is to provide an improved circuit module having a plurality of lead wire ends embedded in a substrate, the unsupported ends extending outwardly from one or both surfaces normal to the major surface supporting the electrical devices.

An additional object of the present invention is to provide a circuit module with lead wires having end portions thereof mechanically anchored in a ceramic dielectric substrate and center portions thereof electrically connected to the conductive paths with metal deposits.

A further object of the present invention is to provide a circuit module with a plurality of lead wires embedded in a side of a substrate and lying in a plane spaced from the major surface of the substrate supporting the electrical devices and the conductive paths for maintaining the surface area at a minimum.

A still further object of the present invention is to provide a circuit module comprising a substrate of ceramic dielectric material having a top surface for supporting the electrical devices and having a sufficient thickness for anchoring the lead wires of the circuit module in the side of the substrate.

Further objects and advantages of the present invention will become apparent as the following description proceeds, and the features of novelty characterizing the invention will be pointed out with particularity in the claims annexed to and forming a part of this specification.

Briefly, the invention is concerned with an improved electrical component of the modular type comprising a substrate of ceramic dielectric material having a plurality of electrical devices supported on a first or major surface thereof and a plurality of lead wires anchored in the substrate and extending outwardly from a second surface normal to the first surface supporting the electrical devices. An end portion of each of the lead wires is fixedly secured or anchored in a cavity communicating with the second surface of the substrate. A pad of conductive material extends completely around each of the openings of the cavities, and the pads of conductive material are electrically connected to the electrical devices supported by the first surface with electrically conductive paths. The center portion of each of the lead wires is electrically connected to the pads of conductive material extending around the openings of the cavities by a metal deposit, for example, solder. Preferably each of the metal deposits is also bonded to a portion of the conductive path adjacent to the pad of conductive material. The metal deposits, therefore, not only mechanically improve the mechanical connection between the substrate and the lead wire, but also assure a good electrical connection between the pads of conductive material and the conductive paths.

For a better understanding of the present invention, reference may be had to the accompanying drawings wherein the same reference numerals have been applied to like parts and wherein.

Figures 1, 2, 3, 4:
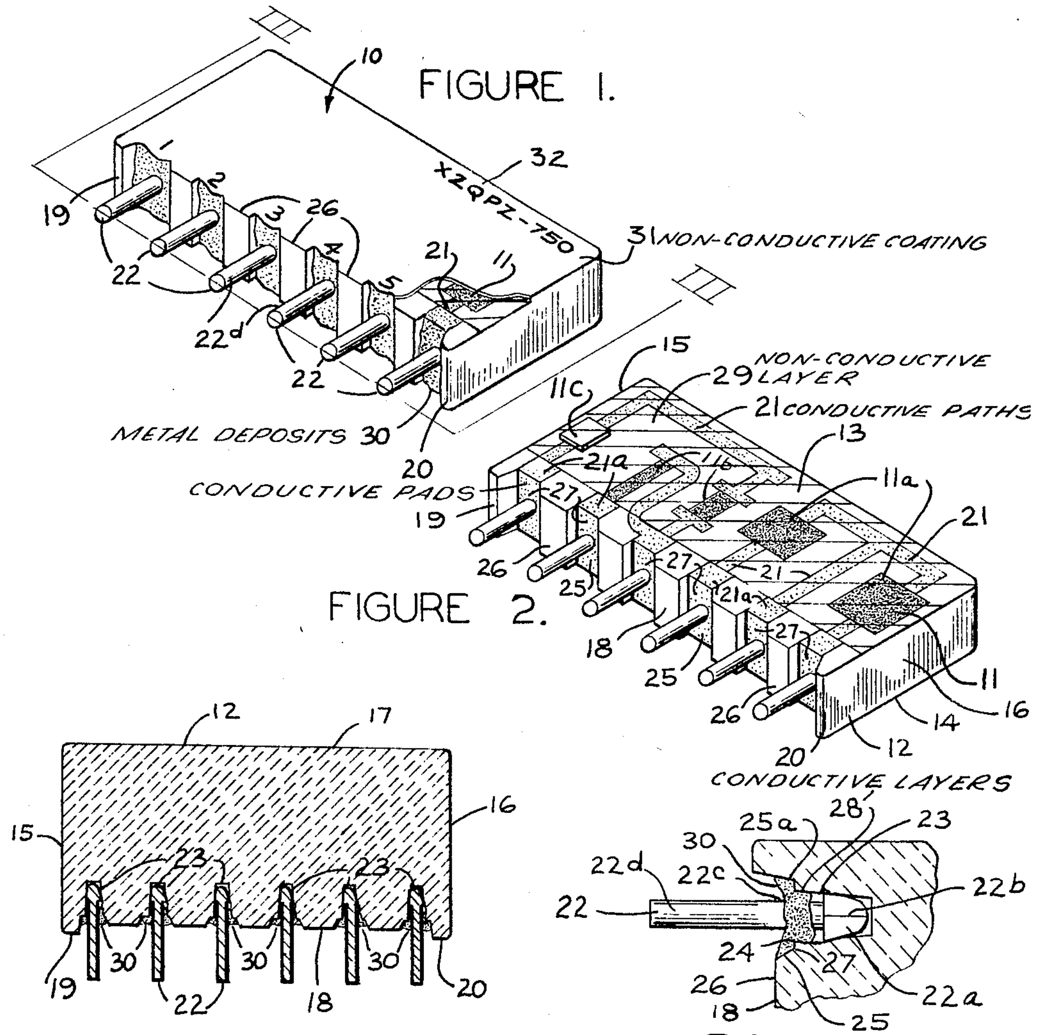
FIGURE 1 is an isometric view of an electrical component built in accord with the present invention with a portion of the coating removed.
FIGURE 2 is an isometric view of the electrical component shown in FIGURE 1 of the drawings before the soldering and encapsulating step.
FIGURE 3 is a cross section taken along line III—III of FIGURE 1.
FIGURE 4 is an enlarged fragmentary section of the electrical component shown in FIGURE 3 of the drawing.
Figure 5:
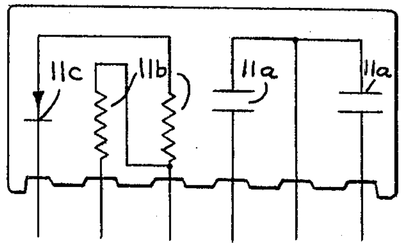
FIGURE 5 is a schematic circuit of the electrical component.

Referring now to the drawings, there is illustrated an electrical component of the circuit module type, generally indicated at 10, comprising a plurality of electrical devices 11 carried by a substrate 12 preferably of a ceramic dielectric material.

Considering first the substrate 12, it is molded of a high temperature heat-resistant material such as alumina or steatite. Inasmuch as the electrical component is pushed or inserted into a not shown mounting panel containing a plurality of connectors, it is preferable that the substrate be provided with a pair of suitable gripping surfaces namely the top surface 13 and the bottom surface 14 of the substrate 12. As illustrated in the drawings, the top or major surface 13 of the substrate 12 is parallel to the bottom surface 14, a pair of end surfaces 15 and 16 are parallel to each other, and the rear surface 17 is parallel to the front surface 18. For ease of gripping and handling, the distance between the top surface 13 and the bottom surface 14 is preferably substantially less than the distance between the rear surface 17 and the front surface 18. Moreover, such construction is also preferable whenever the electrical component 10 is to occupy a minimum area of the mounting panel.

For the purpose of spacing the front surface 18 of the substrate 12 from the mounting panel, the substrate is provided with a pair of forwardly projecting stand-offs 19 and 20. In a preferred form of the invention the stand-offs 19 and 20 are an extension of the end surfaces 15 and 16. It is to be understood, however, that the feet may be spaced inwardly of the end surfaces along the front surface 18 for spacing the front surface 18 of the substrate 12 from the mounting panel. In order to connect the electrical devices 11 supported on the top surface 13 of the substrate 12 to the connectors provided in the mounting panel, a plurality of lead wires 22 are anchored in cavities 23 provided with openings 24 communicating with the front surface 18 of the substrate. Each of the cavities 23 receiving the end of one of the lead wires 22 is preferably located in a recess 25, i.e., a ridge 26 is provided between adjacent cavities 23 in the front surface 18 of the substrate 12.

Figure 6:
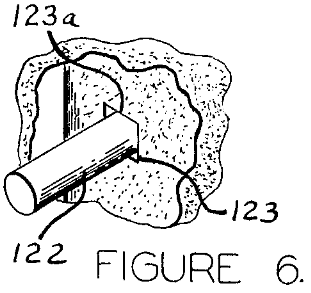
FIGURE 6 is an enlarged fragmentary isometric view of a modified form of the present invention showing a lead wire anchored in a square cross section cavity before applying the metal deposit thereto.

In one form of the invention, the cavities 23 are tapered (see FIGURE 4) to facilitate insertion of the ends of the lead wires 22 thereinto. Cylindrical cavities are also satisfactory since standard inserts can be employed for molding the substrates. Square cross section cavities 123 as shown in FIGURE 6 are, however, preferred since circular cross section lead wires 122 are readily available and, when such lead wires 122 are inserted into the square cross section cavities 123, the edges of the lead wires bite into the sides 123*a* of the cavities for anchoring the ends of the lead wires 122 therein. Regardless of the configuration of the cavities 23, the thickness of the substrate must be at least twice the diameter of one of the lead wires, therefore, sufficient to accommodate the cavities extending partially into the side of the substrate and the lead wires disposed in the cavities. The increased thickness of the substrate 12 also increases the heat dissipating properties of the circuit module.

In producing the electrical component 10 shown in FIGURE 1 of the drawings, generally the first step is to polish the top or major surface 13 of the substrate 12 in a manner well known in the art if the surface is too rough. A network of conductive paths 21 is then deposited, e.g., by a conventional screening process, upon the top surface 13 of the substrate 12. The conductive paths 21 are formed with a good electrically conductive paint, i.e., a composition containing at least one of the nonoxidizing noble metals, dispersed in finely divided form in a vitreous matrix. After the conductive paths 21 have been screened onto the top surface 13 of the substrate 12, the substrate 12 with the conductive paths 21 screened thereon is fired above the fusion temperature of the vitreous matrix, but below that of the metal to drive off the organic vehicles and fuse the vitreous matrix. As best seen in FIGURE 2 of the drawings, some of the conductive paths 21 extend along the top surface of the substrate to the edge of the recesses 25 provided in the front surface 18 of the substrate 12.

The next step comprises the depositing of pads 27 of conductive material onto the inner walls of the recesses 25 and simultaneously the depositing of layers 28 (see FIGURE 4) of conductive material onto the inner walls of the cavities 23. As will be pointed out hereinafter, in a preferred form of the invention, the layers 28 of the conductive material deposited around the edge portions of the cavities 23 and around the openings of the cavities 23 improve the mechanical and electrical connection between the lead wires 22 and the pads 27. The pads 27 of conductive material also overlap the edges of the layers 28 and the end portions 21*a* of the conductive paths 21 disposed on the top surface 13 on the substrate 12. Obviously the pads 27 and the layers 28 of conductive material could be deposited in the recesses 25 and edge portions of the cavities 23 prior to or simultaneously with the step of depositing the conductive paths 21 on the top surface 13 of the substrate or any other suitable sequence so long as electrical continuity between the paths 21, the conductive pads 27, and the layers 28 is obtained. The substrate is preferably fired after each step to bond the material to the substrate.

The electrical devices 11 such as a thin film capacitor 11*a* and thin film resistors 11*b* are deposited on the top surface 13 of the substrate 12 in a suitable manner such as by screening or painting preferably after the paths 21, pads 27 and layers 28 of conductive material have been fired, the edges of the conductive paths 21 being in overlapping relationship with the electrical devices. Inasmuch as the manner of making the electrical devices 11 is not essential to an understanding of the present invention, further details are not included herein. A thorough disclosure of the composition and the method of making the capacitors 11*a* is included in Boykin patent application Serial No. 283,729 filed May 28, 1963, and one of the compositions of the thin film resistors 11*b* is included in Faber, Sr. patent aplication Serial No. 332,702, filed November 12, 1963, both applications being assigned to the same assignee as the present invention. An electrical device such as an active device 11*c* may also be attached to the top surface 13 of the substrate 12 in a suitable manner well known in the art. After all of the electrical devices 11 are supported by the top surface of the substrate, the top surface is coated with a suitable material 29 such as a layer of glass or organic coating material (see FIGURE 2) to protect the electrical devices 11 from atmospheric, and other environmental, conditions.

In accord with one form of the present invention, the lead wires 22 preferably tinned are fixedly secured or anchored in the cavities 23 communicating with the front surface 18 of the substrate 12. The end portions 22*a* of each of the lead wires 22 are provided with lateral projections engaging the side wall of each of the cavities 23, for anchoring the lead wires to the substrate 12, and, as best shown in FIGURE 4 of the drawings, the end portions 22*a* of the lead wire 22 are formed with a plurality of fins or barbs 22*b* similar to arrow heads. The barbs 22*b* of the lead wires 22 engage the side walls of the cavities 23 and the lead wires 22 are forcefully inserted into the cavities for mechanically securing and anchoring the lead wires 22 in the substrate. It is to be understood that the lead wires 22 can extend outwardly from the rear surface 17 as well as the front surface 18, and the free ends of the lead wires can be bent, for example, 90 degrees, or as desired.

It will be appreciated that after the lead wires 22 are fixedly secured in the cavities 23 a good electrical connection must be made between the lead wires 22 and the pads 27 of conductive material surrounding the openings 24 of the cavities 23 for connecting the lead wires 22 to the electrical devices 11. To this end and as best illustrated in FIGURE 4 of the drawings, a metal deposit 30 is adhered to each of the center portions 22*c* of the lead wires 22 and to the pads 27 of conductive material by suitable means such as by dipping the substrate into molten metal, e.g., solder. The metal deposits 30 adhere to the pads 27 of the conductive material surrounding the center portion 22*c* of the lead wires 22 and to the end portions 21*a* of the conductive paths 21 not coated with the material 29 deposited on the top surface 13 of the substrate 12 and cover the junctions between the end portions of the conductive paths 21 and the pads 27 of conductive material. The portions of the metal deposits 30 overlapping the junctions prevent open circuits or high resistance paths formed at the edges of the top surface 13 and the rear walls of the recesses 25. By depositing layers 28 of conductive material around the edge portions of the cavities 23, the metal deposits 30 are attracted partially into the cavities 23 and, upon cooling, the portions of the metal deposits in the cavities further reinforce and mechanically secure the lead wires 22 to the substrate 12. By providing the openings 24 of the cavities 23 in the recesses 25 and by depositing the pads 27 on a portion of the sides 25*a* of the recesses 25, the configuration of each of the metal deposits is controlled to a certain extent and build-up of the metal deposits along the outer portions 22*d* of the lead wires 22 which are tinned is limited, and accordingly, the metal deposits 30 do not interfere with the not shown connectors of the mounting panel when the free ends of the lead wires 22 are inserted thereinto. Otherwise, it would be necessary to increase the length of the stand-offs 19 and 20 for increasing the space between the front surface 18 of the substrate 12 and the mounting panel, thereby reducing the number of electrical devices that can be packaged in one cubic foot.

After the metal deposits 30 have cooled, the circuitry of the electrical component 10 is completed, and the component 10 can be readily inserted into the connectors of the mounting panel. Due to the fact that the lead wires are mechanically secured by anchoring of the end portions 22*a* in the cavities 23 as well as mechanically secured to the front surface of the substrate and the front portion of the cavities 23 by the metal deposits 30, the electrical component 10 can be inserted and removed from the mounting panel without danger of the lead wires being removed from or loosened in the substrate 12.

For the purpose of further protecting the electrical devices 11 supported by the top surface 13 of the substrate 12, a step of applying an electrically nonconductive coating 31 around the substrate can be added to the method of making circuit modules of the present invention to encapsulate the entire circuit module excluding the free end portions 22*d* of the lead wires 22 projecting forwardly from the front surface 18 thereof. For the purpose of identifying the micromodules and the lead wires, a code number 32 can be stamped on the coating 31 of the electrical component 10 distinguishing the electrical component 10 from the other components and numbers can be stamped adjacent to the lead wires 22. Suitable indexing means can be provided in one of the ridges 26 of the substrate if necessary for orientation of the substrate during assembly.

From the above description it will be apparent that a very simple and structurally strong electrical component 10 has been provided. In view of the above discussion, the steps involved in making the electrical components of the present invention will undoubtedly be understood and no further discussion is included herewith.

While there has been illustrated and described what is at present considered to be a preferred embodiment of the present invention, and a single modification thereof, it will be appreciated that numerous changes and modifications are likely to occur to those skilled in the art, and it is intended in the appended claims to cover all those changes and modifications which fall within the true spirit and scope of the present invention.

What is claimed as new and desired to be secured by Letters Patent of the United States is:

1. An electrical component comprising a high heat-resistant substrate of electrically nonconductive material having a flat top surface, a flat bottom surface parallel to the top surface, a pair of end surfaces in spaced relationship, a rear surface and a front surface, the distance between the top surface and the bottom surface being less than the distance between the rear surface and the front surface, a plurality of electrical devices supported by one of the flat surfaces of the substrate, a plurality of spaced ridges extending forwardly from the front surface defining a plurality of spaced recesses arranged along the front surface of the substrate, each of said recesses having a rear wall, said substrate being provided with a cavity communicating with the rear wall of each of the recesses, an electrically conductive material bonded to the rear wall of each of the recesses and encircling an opening of each of the cavities, a plurality of lead wires, one end of each of the lead wires being fixedly secured in each of the cavities directly to the substrate, conductive means electrically connecting the conductive material to the electrical devices, a metal deposit connecting each of the lead wires to the electrically conductive material, and an electrically nonconductive material coating the devices.

2. An electrical component comprising a substrate of ceramic dielectric material having a first surface and a second surface normal to the first surface, a pair of stand-offs projecting forwardly from the second surface for spacing the second surface of the substrate from a mounting surface, said substrate having a plurality of recesses provided in the second surface, said substrate having a plurality of cavities, each of the cavities extending partially into the substrate and having an opening communicating with the recess, a plurality of electrical devices supported by the first surface, a pad of electrically conductive material extending around the opening in each of the recesses, a plurality of electrically conductive paths connecting the electrical devices to the pads of conductive material extending around the openings, a lead wire anchored in each of the cavities directly to the substrate, and a metal deposit disposed in each of the recesses connecting the lead wire to the pad of conductive material surrounding the opening of each of the cavities and to the conductive path.

3. An electrical component comprising a ceramic dielectric body having a first surface and a second surface normal to the first surface, a pair of stand-offs projecting outwardly of the body for spacing the body from a mounting surface, said body being provided with at least a pair of spaced cavities extending partially inwardly into the body and provided with openings communicating with the second surface, a pad of electrically conductive material surrounding each of the openings and bonded to the second surface, at least one electrical device supported by the first surface, a plurality of electrically conductive paths connecting the electrical device to the pads of electrically conductive material, a lead wire disposed in each of the cavities and anchored directly to the ceramic dielectric body, a metal deposit electrically connecting each of the lead wires to the pads of electrically conductive material, and an electrically nonconductive material encapsulating the ceramic dielectric body.

4. In an electrical component, the combination of a ceramic dielectric substate having a smooth first surface and a second surface normal to the first surface, a plurality of electrical devices supported by the smooth first surface, said substrate being provided with a plurality of cavities extending partially into the body of the substrate, each of said cavities being provided with an opening communicating with the second surface, a pad of conductive material surrounding the opening of each of the cavities, a lead wire disposed in each of the cavities, a lateral projection integral with each of the lead wires engaging the inner wall of each of the cavities, a layer of conductive material disposed around the edge portion of each of the cavities, and electrical means connecting the center portion of each of the lead wires to the layers of conductive material, to the pads of conductive material, and to the electrical devices.

5. In an electrical component having a ceramic dielectric substrate provided with a plurality of cavities having an inner wall, and a plurality of electrical devices supported by the substrate, the improvement comprising a lead wire disposed in each of the cavities, means integral with the end portion of each of the lead wires engaging the inner wall of each of the cavities, a layer of conductive material covering a portion of the inner wall of each of the cavities, a pad of conductive material surrounding the opening of each of the cavities, a plurality of conductive paths connecting the pads to the electrical devices, and a plurality of metal deposits connecting the center positions of the lead wires to the layers of conductive material and to the pads of conductive material surrounding the cavities and to a portion of each of the conductive paths adjacent to the pads of conductive material.

6. An electrical component comprising a ceramic dielectric body having a first surface and a second surface normal to the first surface, a plurality of electrical devices supported by the first surface, said body being provided with a plurality of cavities extending partially into the substrate and provided with openings communicating with the second surface, a lead wire disposed in each of the cavities, means integral with the lead wires engaging the inner walls of the cavities, a layer of conductive material covering a portion of the inner wall adjacent to the opening of each of the cavities, a pad of conductive material surrounding the opening of each of the cavities, a conductive path connecting each of the pads of conductive material to the electrical devices, and electrical means connecting the center portion of each of the lead wires to the layer of conductive material and to the pad of conductive material surrounding the opening of each of the cavities.

7. An electrical component comprising a ceramic dielectric substrate having a first surface and a second surface, a plurality of electrical devices supported by the first surface, a plurality of spaced ridges extending forwardly from the second surface defining a plurality of spaced recesses communicating with the second surface, each of said recesses having an inner wall, the substrate being provided with a plurality of cavities extending into the substrate, each cavity being provided with an opening communicating with the inner wall of the recess, a pad of conductive material deposited on the inner wall of each of the recesses, a plurality of conductive paths connecting each of the pads to the electrical devices, a plurality of lead wires having one end anchored in each of the cavities directly to the substrate, and a plurality of metal deposits bonded to the pads of conductive material surrounding the openings of the cavities and bonded to portions of the conductive paths in overlying relationship with respect to the pads and bonded to the center portions of the lead wires.

8. In an electrical component, the combination of a ceramic dielectric substrate having a smooth first surface and a second surface normal to the first surface, a plurality of electrical devices supported by the smooth first surface, said substrate being provided with a plurality of cavities extending partially into the body of the substrate and lying below the electrical devices, each of said cavities being provided with an opening communicating with the second surface, a pad of conductive material surrounding the opening of each of the cavities, a plurality of lead wires, one of the end portions of each of the lead wires being anchored in the cavities directly to the substrate, a layer of conductive material covering a portion of the substrate adjacent to each of the lead wires, and electrical means connecting the center portion of each of the lead wires to the layers of conductive material, to the pads of conductive material, and to the electrical devices.

9. In an electrical component, the combination of a ceramic dielectric body having a first surface and a second surface normal to the first surface, at least one electrical device supported by the first surface, said body being provided with at least a pair of cavities extending partially into the body and provided with openings communicating with the second surface, a pad of conductive material surrounding the opening of each of the cavities, a layer of conductive material disposed around the edge portion of each of the cavities, a lead wire disposed in each of the cavities and anchored directly to the dielectric body, and means electrically connecting the lead wires to the pads of conductive material, to the layers of conductive material, and to the electrical device.

10. The electrical component of claim 9, wherein the second surface defines the thickness of the body and the thickness of the body is at least twice the diameter of one of the lead wires for structurally supporting the lead wires thereby maintaining the first surface at a minimum area for supporting solely electrical devices.

(References on following page)

References Cited by the Examiner

UNITED STATES PATENTS

| | | | |
|---|---|---|---|
| 3,002,481 | 10/1961 | Hutters. | |
| 3,029,495 | 4/1962 | Doctor | 317—101 X |
| 3,052,822 | 9/1962 | Kilby | 317—101 |
| 3,122,679 | 2/1964 | Kislan et al. | 317—101 X |
| 3,185,952 | 5/1965 | Potter et al. | 29—155.5 X |

OTHER REFERENCES

Electrical Manufacturing, August 1958, "Microminiature Components For Electronic Circuits," pages 94 to 97.

References Cited by the Applicant

UNITED STATES PATENTS

| | | |
|---|---|---|
| 2,989,665 | 6/1961 | Khouri. |
| 3,105,868 | 10/1963 | Feigin et al. |
| 3,134,049 | 5/1964 | Kilby. |
| 3,142,000 | 7/1964 | Bernstein. |
| 3,177,406 | 4/1965 | Bernstein. |
| 3,179,854 | 4/1965 | Luedicke et al. |

ROBERT K. SCHAEFER, *Primary Examiner.*

KATHLEEN H. CLAFFY, MAX L. LEVY, *Examiners.*

W. C. GARVERT, *Assistant Examiner.*